United States Patent [19]

Fredericks et al.

[11] Patent Number: 4,481,465
[45] Date of Patent: Nov. 6, 1984

[54] CAPACITIVE MEASURING TRANSDUCER

[75] Inventors: George E. Fredericks, Graz; Horst Preschern, Leibnitz, both of Austria

[73] Assignee: Hans List, Graz, Austria

[21] Appl. No.: 247,294

[22] PCT Filed: Aug. 18, 1980

[86] PCT No.: PCT/AT80/00027
§ 371 Date: Mar. 27, 1981
§ 102(e) Date: Mar. 27, 1981

[87] PCT Pub. No.: WO81/00620
PCT Pub. Date: Mar. 5, 1981

[30] Foreign Application Priority Data

Aug. 29, 1979 [AT] Austria .................................. 5774/79

[51] Int. Cl.³ ....................... G01R 11/52; G01R 27/26
[52] U.S. Cl. .................................................. 324/60 CD
[58] Field of Search ............. 324/60 CD, 60 C, 61 R; 340/510

[56] References Cited

U.S. PATENT DOCUMENTS 3,519,923  7/1970  Martin et al. .

FOREIGN PATENT DOCUMENTS

| 2443886 | 3/1976 | Fed. Rep. of Germany . | |
| 3117878 | 2/1982 | Fed. Rep. of Germany | 324/61 R |
| 2373038 | 12/1977 | France | 324/60 CD |
| 939660 | 10/1963 | United Kingdom | 324/60 CD |

OTHER PUBLICATIONS

Phillips, "Capacitive Ink Level Detector"–IBM Bulletin, Mar. 1974.

*Primary Examiner*—Stanley T. Krawczewicz
*Assistant Examiner*—Jose M. Solis
*Attorney, Agent, or Firm*—Watson, Cole, Grindle & Watson

[57] ABSTRACT

Capacitive measuring transformer, especially for small capacitance values, with two parallel bridge arms, connected with an oscillator, each of which has at least one capacitor, whereby a differential amplifier is provided which is connected on the input side with the bridge arms and the input of which is connected by a feedback circuit, containing passive elements only to one of the bridge arms. A control element ($D_1$, $D_2$) precedes every one of the bridge arms and a fixed potential or a potential changing inversely in relation the outlet of said differential amplifier, ($OA_1$) is applied to the second bridge arm. As a result, one will moreover achieve a high measure of stability and linearity between capacitance and output voltage. The fixed potential is used when the feedback is to one bridge arm only. The potential changing inversely in relation to the output of the differential amplifier ($OA_1$) is used when the feedback to both bridge arms gives the highest degree of stability and linearity.

7 Claims, 2 Drawing Figures

CAPACITIVE MEASURING TRANSDUCER

BACKGROUND OF THE INVENTION

1. Field of the Invention

The invention relates to capacitive measuring transducer apparatus, especially for small capacitive values, and more particularly to such apparatus with two bridge arms, each of which has at least one capacitor, and incorporating a differential amplifier connected on the input side with the bridge arms, each possibly having an amplifier, and the output of the differential amplifier is fed back to one of the bridge arms.

2. Prior Art

Such measuring transducer apparatus is disclosed in German OS No. 2 641 758. In case of this known measuring transducer, the two bridge arms, each of which has an amplifier, in the control circuit of which there is a capacitor or a parallel connection of capacitors and in the main circuits of which there always is a resistance combination for interconnecting terminal points of the bridge arms and an oscillator. The evaluation of capacitance changes of one or two of the capacitors disposed in different bridge arms takes place in the known case by way of the amplifiers acting as charge amplifiers, -which may be, for example, d.c. current operational amplifiers with a capacitive feedback, which may produce an output voltage, which is directly proportional to the change of the charge at the input connections. The differential amplifiers evaluate the output signals, to which a filter and a phase demodulator is series connected, the second input of which is connected with the oscillator, as well as a differential amplifier series connected to the phase demodulator, and a wave-band filter. The output voltage of the wave-band filter, at the same time, is fed back to a bridge arm via an analog multiplier, which precedes the latter.

The disadvantage of this known transducer lies in the fact that the individual parts of the circuit are very expensive and that the consequent costs are very high, to which the analog-multiplier also contributes considerably. Another disadvantage of this transducer, which operates according to the carrier-frequency method, also results from the fact that a sinusoidal generator is needed, in case somewhat higher demands are made, and this likewise results in a considerable expense.

SUMMARY OF THE INVENTION

It is the goal of the invention to propose a transducer of the initially mentioned type which is distinguished by a simple construction and nevertheless has a high degree of stability.

This will be achieved according to the invention by connecting a control element in series with each bridge arm. One of the terminals of the control elements is connected together and this common point is connected to the output of a square wave generator. The other terminals of the control elements, along with their respective bridge arms are each connected through at least one passive circuit element to a potential source. A feed-back circuit is provided, consisting of essentially passive circuit elements and which is connected to one of the capacitors in one of the bridge arms, whereas the corresponding capacitor in the other bridge arm is connected, via a passive circuit element to a fixed potential or to a potential which is determined by the differential amplifier and which varies in an inverse manner with the output of the differential amplifier.

The potential at the bridge arms is changed by way of the control elements by the pulse train delivered from the oscillator, in correspondence with the pulse train, whereby potential changes on the electrodes of the capacitors occur, and charge transferring currents develop in the bridge arms, corresponding to the capacitance values of the capacitors. Differences in the currents of the bridge arms or voltage differences at certain points of the two bridge arms are amplified by the differential amplifier and are fedback to a bridge arm via the feedback circuit to influence the extent of the potential variations on the basis of the pulse train coming from the oscillator in one bridge arm, whereas the second bridge arm is influenced during the off period of the control elements by a fixed potential or the differential output of the differential amplifier.

As a result it will be possible to make do with a very simple construction, whereby a very high stability and linearity will be achieved by a correspondingly strong feedback.

According to another characteristic of the invention provision has been made that the control elements are made up by diodes and the pulse train delivered by the oscillator fluctuates between fixed values which lie above and below the potential of the connecting points of the diodes with the bridge arms, shifted by the forward voltage of the diodes, which results in a particularly simple construction.

Basically, however, it is also possible, to provide transistor or controlled rectifiers at one of the terminal points of the bridge arms instead of the diodes and to connect them to a d.c. voltage source serving as an auxiliary voltage, whereby then these units are acted upon by an additional auxiliary voltage source, supplying a pulse train consisting of rectangular pulses. An alternating change of the charges of the capacitors of the bridge will likewise be achieved, whereby the changes in capacitance of a capacitor, as has been described already, likewise effect a change of the relationship of the currents flowing through the two bridge arms, which leads via the amplifiers and the differential amplifier to a change of its output voltage.

Since the bridge along with the amplifiers are turned on and off practically in the rhythm of the through connection of the control elements connecting the two bridge arms with the auxiliary source of voltage, high common mode variations result at the outputs of the amplifiers or at the inputs of the differential amplifier. In order to avoid these variations, provision has been made advantageously for the inputs of the differential amplifier to be always connected with a capacitor, whereby the two other electrodes of these capacitors are connected jointly to a fixed potential, as a result of which the common mode variations are dampened or smoothed very greatly and therefore one will be able to make do with a very much more simply structured differential amplifier.

A particularly extensive suppression of the common mode variations results whenever the inputs of the differential amplifier are each connected with a capacitor, whereby the two other electrodes of these capacitors are connected jointly with a potential divider, connected to a fixed potential, the central connection of which is connected via a diode with the oscillator. By this measure it will be possible to achieve a very high damping of the common mode variations even with very small capacitors.

In a preferred embodiment of the invention provision has been made that the control inputs of two amplifiers, preferably formed by transistors, are connected to the connecting points of the bridge arms, each of said bridge arms consisting preferably of two capacitors, and that the outputs of the amplifiers are connected with the differential amplifier. As a result it will be possible to use small capacitors. Thus the possibility results of using an auxiliary voltage with high frequency, supplied by the oscillator, as the result of which, capacitive changes occurring very rapdily are still determinable.

According to a further characteristic of the invention provision has been made that the connection points of the individual bridge arms connected with the control inputs of the amplifiers, preferably made up by transistors, are connected via diodes and when required, parallel connected resistors with a fixed potential. In this way one will achieve a limitation of the inverse emitter basis voltages of the transistors, whereby, as a result of a parallel connection of resistances to these limiting diodes, possible differences in their characteristics remain practically without influence on the measurement.

In order to increase the linearity between the output signal of the converter or of the differential amplifier and of the capacitance, it will be of advantage, whenever the emitters of the transistors connected with their bases with the connecting point of each of the assigned bridge arms, are each connected via one resistance with another resistance connected to a fixed potential.

In a measuring circuit, in which an amplifier is disposed in each bridge arm, and the differential amplifier is connected on the input side with the main current path of these amplifiers, provision has been made, according to another characteristic of the invention, for the emitter of the transistors provided as amplifiers to be connected with resistances, which are series connected preferably with condensers and with their connected discharge resistances and the emitters and the bases of these transistors are connected via resistances to a fixed potential, whereby the bases of the transistors are connected with these capacitors of the bridge arms, which are connected with the control elements. In case of such measuring circuits it is possible to provide very small capacitances in the base circuit of the transistors in connection with low resistance discharge resistances, so that small time constants result and a rectangular pulse sequence with high frequency may be applied to the control elements. As a result it will be possible to determine even very short duration changes in capacitance, especially whenever one or two variable capacitors lie in the main current path of the transistors.

In case of such a measuring circuit it will furthermore be of advantage, whenever the second electrodes of the capacitors lying in the main current path of the transistors and the discharge resistances are connected to a joint fixed potential, whereby the potential connected with the resistances is more negative than the inputs of the differential amplifier. By this latter measure, one will achieve that the level of the common mode voltage at the inputs of the differential amplifier will remain far enough removed from the potentials of its supply voltage. A particularly high measure of linearity between the output voltage and the capacitance to be measured results, whenever the output of the differential amplifier is fed back directly and via an inverter to the bridge arms. The same may also be achieved by feedback of a differential output of the differential amplifier to the second bridge arm via passive circuit elements.

BRIEF DESCRIPTION OF THE DRAWINGS

The above objects, advantages and features of the invention will now be explained in more detail on the basis of the following description of preferred embodiments of the best mode of carrying out the invention in conjunction with the drawings, wherein.

DETAILED DESCRIPTION OF THE PREFERRED EMBODIMENTS

Figure 1:
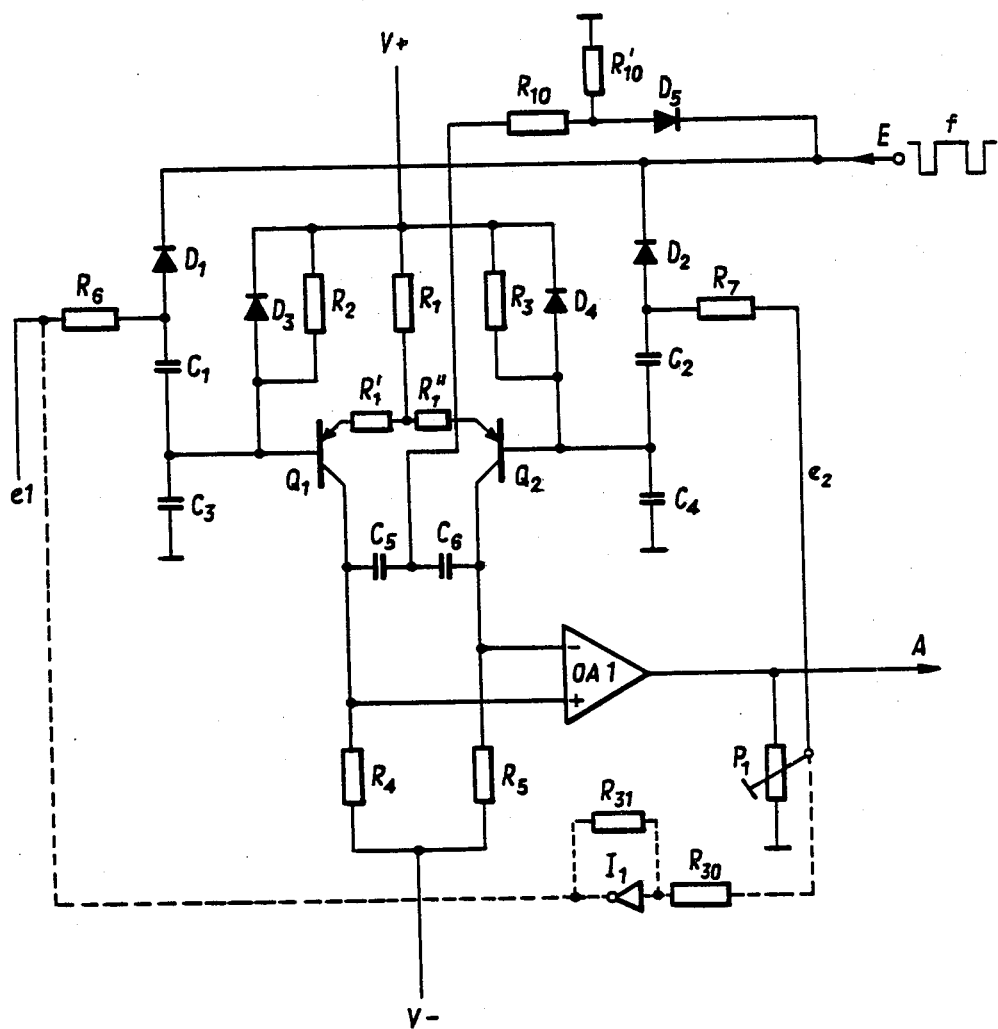
FIG. 1 shows an embodiment with voltage tap on the bridge arms.

In the case of the embodiment according to FIG. 1, the bridge arms are formed by capacitors $C_1$, $C_3$ and $C_2$, $C_4$ whereby one electrode of the capacitors $C_3$, $C_4$ is jointly connected to a fixed potential, for example, ground. The two other ends of the two bridge arms are connected via the resistor $R_6$ to a potential $e_1$, and via the resistor $R_7$ to a potential $e_2$, whereby the potential $e_2$ is derived from the output voltage of the measuring circuit for the purpose of feedback via the potentiometer $P_1$. Furthermore, these ends of the bridge arms are connected via the diodes $D_1$ and $D_2$ with an auxiliary source of voltage not shown, which delivers a pulse train consisting of rectangular impulses.

The connecting points of the two capacitors $C_3$, $C_1$ and $C_2$, $C_4$ constituting respective bridge arms are respectively connected with the bases of the two transistors $Q_1$, $Q_2$, combined preferably in a small integrated pair, which serve as amplifiers. Furthermore, these connecting points are applied via diodes $D_3$, $D_4$ and via resistors $R_2$, $R_3$ connected in parallel to the former, to a fixed potential $V+$. The resistor $R_1$ with which the emitters of the two transistors $Q_1$, $Q_2$ are connected via additional emitter resistors $R_1'$, $R_1''$, is connected also to this potential. Furthermore, the joint connecting point of two capacitors $C_5$, $C_6$, serving for the common mode variation limitation of the differential amplifier $OA_1$ is applied to this potential. These capacitors are connected with the collectors of the transistors $Q_1$, $Q_2$ along with the inputs of the differential amplifier $OA_1$. Furthermore, the collectors of the transistors $Q_1$, $Q_2$ along with inputs of the differential amplifier $OA_1$ are connected with resistors $R_4$, $R_5$ which are jointly connected to a fixed potential $V-$.

This circuit has two operational states: The first state, which in the following will always be called the basic position, occurs whenever the pulse input is high ("high" means a voltage more positive than either the potential $e_1$ or the potential $e_2$). After some time in this state practically no current flows into the capacitance bridge. The diodes $D_1$ and $D_2$ are in the blocking state. One of the electrodes of capacitor $C_1$ is at the potential $e_1$, one of the electrodes of capacitor $C_2$ is at the potential $e_2$. The potential $e_2$ will be determined by the output voltage and the adjustment of the potentiometer $P_1$. The center points of the bridge and therefore also the bases of the two transistors $Q_1$, $Q_2$ are at the potential of one of the poles $V+$ of a d.c. voltage source through resistors $R_2$ and $R_3$. Since the emitters of the transistors $Q_1$, $Q_2$ are also connected with the same pole $V+$ via the resistors $R_1'$, $R_1''$ and $R_1$, the transistors $Q_1$, $Q_2$ block, and the capacitors $C_5$, $C_6$ are being charged. These capacitors $C_5$, $C_6$ are interconnected and are also connected to a voltage divider made up by the resistors $R_{10}$, $R_{10}'$, which divider is connected to a fixed potential and the center tap of which is connected via a diode $D_5$ with the pulse input E or with the oscillator. The second state of the circuit which in the following will be called the active position, occurs whenever the pulse input is set on LOW. "LOW" means a voltage considerably more negative than the potential $e_1$, $e_2$. The diodes $D_1$ and $D_3$ become conductive. The one electrode from capacitors $C_1$ and $C_2$ drops down to a voltage $e_3$, whereby $e_3$ is a potential which lies by one diode forward voltage higher than the potential existing at the pulse input. Because of the steep negative edge of the input pulses a relatively great current flows for a short time through the capacitor bridge $C_1$, $C_3$, $C_2$, $C_4$ and through the bases of the two transistors $Q_1$, $Q_2$. These base currents cause reinforced collector currents which cause corresponding drops in voltage via the resistors $R_4$, $R_5$, whereby the potentials existing as a result on the collectors of the transistors $Q_1$, $Q_2$ are fed to the inputs of the differential amplifier $OA_1$. The common mode variation at the inputs of the differential amplifier $OA_1$, resulting at the moment of connecting-through, is dampened by the capacitors $C_5$, $C_6$ and by the resistors $R_{10}$ and $R'_{10}$ and the diode $D_5$. At the same time the positive voltage jump resulting in the moment of connecting-through of the transistors $Q_1$, $Q_2$ with interconnected electrodes of the capacitors $C_5$, $C_6$ leads to a connecting through of the diode $D_5$ to the pulse input E, where at this time a LOW-signal is applied. First of all it is assumed that the capacitance of capacitors $C_1$ $C_2$, $C_3$ and $C_4$ are equal and that voltage $e_2$ equals voltage $e_1$. In this case the charge transmissions on both sides of the bridge are equal, and the two transistors $Q_1$, $Q_2$ cause equally large potential changes at the inputs of the differential amplifier as soon as they have become conductive on the basis of a "LOW" signal existing at the pulse input.

Whenever the capacitance of capacitor $C_3$ does not equal the capacitance of capacitor $C_4$ and voltage $e_2$ equals voltage $e_1$, or whenever the capacitance of capacitor $C_3$ equals the capacitance of capacitor $C_4$ and voltage $e_2$ does not equal voltage $e_1$, the charge changes are unequal and the potentials taken at the collectors of the transistors $Q_1$, $Q_2$ or the resistors $R_4$, $R_5$ become unequal, as a result of which the output voltage of the amplifier $OA_1$ changes. The circuit remains in this active state for only a relatively short time and the positive going leading edge of the input pulse again returns the circuit into its basic state. The diodes $D_3$ and $D_4$ limit the inverse emitter base voltages and the parallel connected resistances $R_2$ and $R_3$ avoid the effect on the measurement of possible differences in the characteristic curves of the diodes $D_3$, $D_4$.

The pulse frequency will effectively be adjusted as high as possible, but with consideration to the time needed for the circuit to stabilize itself in its basic state. The resistors $R_4$ and $R_5$ are proportional such that the inputs of the amplifier $OA_1$ remain within its common mode voltage range, and that the collectors of the two transistors always have a negative potential vis-a-vis the emitters. The values $C_5$ and $C_6$ are so great, that the common mode variation remains small after each negative input pulse.

The drawing shows, that one side of the two capacitors $C_3$ and $C_4$ is connected to a constant potential, for example, ground, i.e., $C_3$ and $C_4$ may represent a differential capacitor. This is the case with many capacitive transducer types. Whenever $C_1$ equals $C_2$ and $C_3$ and $C_4$ form a transducer, then it will be possible to measure very small changes of capacitance, whenever the amplifier $OA_1$ has a high open loop amplification, whereby the circuit is kept stable by inverse feedback from the output. In this connection, the invention shows in the case of such measuring transducers for the first time the possibility for the arrangement of an inverse feedback formed merely by resistances.

The potential $e_1$ may be a constant potential (even zero) or it may be fed by an inverse feedback from the amplifier $OA_1$, whenever the latter has a differential output. Furthermore, the potential $e_1$, as indicated by a broken line may be fed by the tap of the potentiometer $P_1$ via an inverter $I_1$, wired with the resistances $R_{30}$, $R_{31}$. In the latter case a particularly good linearity results between the capacitance of the capacitors $C_3$, $C_4$ and the output voltage of the differential amplifier $OA_1$, whereby the extent of the inverse feedback is easily adjustable.

It is also possible to use transistors instead of the diodes $D_1$ and $D_2$, which are acted upon at their bases together with a pulse train, preferably consisting of rectangular impulses, in order to establish alternatingly a connection between the capacitors $C_2$ or $C_1$ and a fixed potential the height of which must naturally be different from that of the potentials $e_1$ and $e_2$.

Another change of the illustrated circuit is also possible in such a way, that a differential amplifier $OA_1$ with differential output is used, and the potential $e_1$ is tapped by the second of the differential outputs.

The following is a Table of values for certain of the components shown in FIG. 1.

| | | | | | |
|---|---|---|---|---|---|
| $R_1 =$ | 15 K$\Omega$ | $R_6 =$ | 10 K$\Omega$ | $C_5 =$ | 0.01 $\mu$F |
| $R_1' =$ | 10 K$\Omega$ | $R_7 =$ | 10 K$\Omega$ | $C_6 =$ | 0.01 $\mu$F |
| $R_1'' =$ | 10 K$\Omega$ | $R_{30} =$ | 22 K$\Omega$ | | |
| $R_2 =$ | 27 K$\Omega$ | $R_{31} =$ | 22 K$\Omega$ | | |
| $R_3 =$ | 27 K$\Omega$ | $P_1 =$ | 10 K$\Omega$ | | |
| $R_4 =$ | 330 K$\Omega$ | $C_1 =$ | 22 pF | | |
| $R_5 =$ | 330 K$\Omega$ | $C_2 =$ | 22 pF | | |

When the above values are used, the resistances $R_{10}$ and $R_{10}'$ are equal to zero and the diode $D_5$ is eliminated.

$C_3$ and $C_4$ are each respective halves of a differential capacity transducer. In the center position each half has a capacity of approximately 10 pF.

The diodes $D_1$, $D_2$, $D_3$ and $D_4$ can be general purpose diodes such as 1N914 or, for better zero point stability, $D_1$ and $D_2$ as well as $D_3$ and $D_4$ can be diode pairs such as type BAV 70 from Motorola. The transistors $Q_1$ and $Q_2$ are preferably paired transistors on a single chip such as type 2N4937 from Motorola.

The amplifier $OA_1$ and the inverter $I_1$ are conveniently halves of a double amplifier such as type LF 353 from National Semiconductor.

V+ and V− are ±15 volts and serve also as power supplies for the LF 353.

The pulse input at point E has the following characteristics:

The amplitude can vary from +3 V to +15 V and to −15 V. However, the conversion factor, output-volts/-capacity change, is dependent on the negative voltage and it should therefore be stable.

The negative going pulse edge should have a slope of approximately 300 V per micro-second. The positive going pulse edge is not important but if its slope is greater than 20 V per micro-second, then a frequency of approximately 200 KHz can be used when the source is a square wave generator. This frequency can be increased if the dwell time at $-15$ V is made shorter than the positive dwell time. For instance, a dwell time of 0.5 micro-second at $-15$ volts and a repetition rate of 300 to 400 KHz. The dwell times should be long enough for the bridge currents to sink to practically zero. When this is the case then the conversion factor, output-volts/capacity change, is not sensitive to small changes in slope, pulse width or repetition rate, due to the stabilizing effect of the negative feed-back at points $e_1$ and $e_2$.

With $P_1$ so adjusted that approximately 10% of the output voltage is fed back to the points $e_1$ and $e_2$, the conversion factor is approximately 10 volts output per pico-farad of bridge unbalance.

Figure 2:
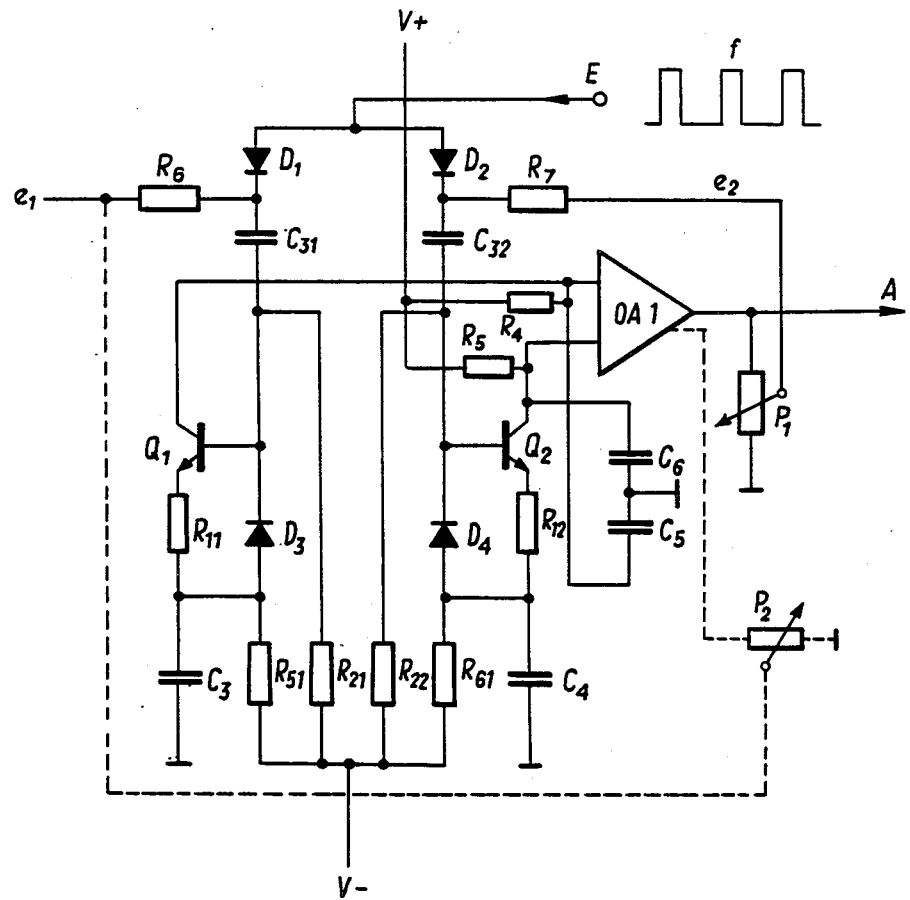
FIG. 2 shows an embodiment with amplifiers inserted into the bridge arms.

In case of the embodiment of FIG. 2, the two bridge arms are made up by the capacitor $C_{31}$, the emitter resistor $R_{11}$ and the capacitor $C_3$ or the capacitor $C_{32}$, the emitter resistor $R_{12}$ and the capacitor $C_4$. The transistors $Q_1$, $Q_2$ at the same time, are connected to the bridge arms as amplifiers, and are connected with their collectors with the inputs of the differential amplifier $OA_1$. The capacitors $C_3$, $C_4$ in the main current paths of the transistors $Q_1$, $Q_2$ are connected with discharge resistors $R_{51}$, $R_{61}$ which, however, are connected to another fixed potential $-V$ than the latter themselves, whereby the potential connected with the resistors $R_{51}$, $R_{61}$ is more negative than the potential applied at the inputs of the differential amplifier $OA_1$, and thus the common mode voltage at its input remains sufficiently far removed from the potentials of its supply voltage. Furthermore, the emitters and the bases are connected with the same potential V, via the resistors $R_{51}$, $R_{21}$, or $R_{61}$, $R_{22}$. At the same time a modification of the circuit would also be possible, according to which the resistors $R_{21}$, $R_{22}$ are connected with one of their terminals with the resistors $R_{11}$ and $R_{51}$ or $R_{12}$ and $R_{61}$ instead of with the potential V, and thus would be connected in parallel to the diodes $D_3$ or $D_4$, which limit the inverse-emitter-basis voltage.

The remaining part of the circuit, especially the feedback of the output of the differential amplifier $OA_1$ via the potentiometer $P_1$ and the resistor $R_7$ to the one bridge arm is identical to the circuit according to FIG. 1. Merely the capacitors $C_5$, $C_6$ provided at the inputs of the differential amplifier $OA_1$ for damping the common mode variation, are connected directly to a fixed potential instead of to the pulse input E via a diode $D_5$. FIG. 2, otherwise indicates the possibility of the feedback of a differential output of the differential amplifier $OA_1$ to the second bridge arm via the potentiometer $P_2$ by a broken line.

The potential of the pulse train f, arriving at the input E, changes between values, which lie above and below the potentials $e_1$ or $e_2$, at the capacitors $C_{31}$, $C_{32}$, shifted by as much as the forward voltage of the diodes $D_1$, $D_2$.

Whenever there is a negative potential at input E, then the diodes $D_1$ and $D_2$ lock and the one electrodes of the capacitors $C_{31}$, $C_{32}$ take on the potential $e_1$ or $e_2$, and then no current flows in the circuit until a positive going leading edge of the pulse train f terminates the basic state. In that case, the diodes $D_1$, $D_2$ become conductive and the potential variation is transferred via the capacitors $C_{31}$, $C_{32}$ to their electrodes connected with the bases of the transistors $Q_1$, $Q_2$ and of the resistors $R_{21}$ or $R_{22}$, so that currents flow via these resistors, of which the ones flow off via the bases of the assigned transistors $Q_1$, $Q_2$ and connect them through. Despite the more positive potential at input E, that of the electrodes of the capacitors $C_{31}$ or $C_{32}$ connected with the bases and the resistors $R_{21}$ or $R_{22}$, decreases and on the other hand the potential of the electrode of the capacitor $C_3$ or $C_4$, connected with the assigned transistor $Q_1$ or $Q_2$ via the emitter resistors $R_{11}$ or $R_{12}$ increases, as a result of which the base voltage of the transistors $Q_1$, $Q_2$ decreases and the latter become non-conductive. The emitter resistors $R_{11}$, $R_{12}$ moreover prevent the transistors $Q_1$, $Q_2$ from being saturated. In any case, the non-conduction of the transistors $Q_1$, $Q_2$ occurs, whenever a negative edge of the pulse train f arrives at input E, since then the potential of the one electrode of the capacitors $C_{31}$, $C_{32}$ drops to the level of the potentials $e_1$ or $e_2$ and this potential variation is transferred to the second electrodes and thus to the bases of the transistors $Q_1$, $Q_2$. The diodes $D_3$, $D_4$ in this case limit the base-emitter inverse voltages.

In case of the non-conductivity of transistors $Q_1$, $Q_2$ the capacitors $C_3$, $C_4$ are discharged via the resistors $R_{51}$ or $R_{61}$ and partly also via the diodes $D_3$ or $D_4$ and the resistors $R_{21}$ or $R_{22}$, whereby the potential of the electrodes of the capacitors $C_{31}$, $C_{32}$ connected with said resistors after their negative potential change, conditional on the negative edge of the pulse train is again raised, so that the circuit quickly passes over into its basic state, in which practically no current flows.

Differences in the currents flowing over the emitter collector sections of the transistors $Q_1$, $Q_2$ are amplified by the differential amplifier $OA_1$ connected with these sections. Whenever the capacitance of one of the capacitors $C_3$, $C_4$ changes, or-in case these are the part-capacitors of a differential capacitor-of both capacitors, then the consequence of this is a change of the currents, flowing via the emitter-collector sections of the transistors $Q_1$, $Q_2$, as a result of which the output signal of the differential amplifier $OA_1$ also changes. Thus the potential also changes, however, which during the basic state of the circuit was applied to the electrode of the capacitor $C_{32}$, connected with the diode $D_2$, since this electrode is connected with the output A, via the feedback, consisting of the resistor $R_7$ and the potentiometer $P_1$. This in turn, influences the size of the potential variation, conditional on the next positive edge of the pulse train, which in turn determines the size of the base current, flowing off into the base of the transistor $Q_2$, which on its part determines the size of the current, flowing via the emitter-collector section. The potential $e_1$ applied during the basic state of the circuit of the capacitor $C_{31}$, with which said capacitor is connected via the resistor $R_6$, on the contrary remains unchanged or is taken off by a second differential output of the differential amplifier $OA_1$. A further possibility consists in the fact of connecting the output of the differential amplifier $OA_1$ by way of feedback to the second bridge arm via an inverter, as shown in a broken line in FIG. 1.

In this way the circuit is kept in equilibrium, whereby one will get along with a very low feedback energy, since it does indeed act on the base circuit.

As a result of the two capacitors $C_6$, $C_5$ connected to a fixed potential and lying in parallel to the inputs of the differential amplifier $OA_1$ the common mode variation at the inputs of the differential amplifier is suppressed or decreased.

In case of the circuit of FIG. 2, various changes are conceivable. Thus, the resistors $R_6$ and $R_7$ may also be connected with the electrodes of the capacitors $C_3$, $C_4$, connected with the emitter resistors $R_{11}$, $R_{12}$ of the transistors $Q_1$ or $Q_2$, instead of with the diodes $D_1$ or $D_2$. In this case, this would result, during the basic state of the circuit, in a charge of the capacitor $C_4$, dependent on the output voltage of the differential amplifier $OA_1$, which again influences the current flowing via the transistor $Q_2$ during the active phase of the circuit. In case of this variation, fixed potentials would have to be applied via resistances to the capacitors $C_{31}$, $C_{32}$ or the diodes $D_1$, $D_2$.

In case of the circuit as in FIG. 2, the capacitors $C_{31}$, $C_{32}$ may have very small values, as a result of which very small time constants become possible and one will be able to operate with a pulse train delivered by an oscillator, not shown, in the MHz-area, as a result of which changes of capacitance of the measuring capacitors $C_3$, $C_4$, taking place very quickly may be determined.

A further variation of the circuit as in FIG. 2, would also be possible in the sense that a resistance is interconnected between the base of each transistor $Q_1$, $Q_2$ and the assigned capacitor $C_{31}$, $C_{32}$ and that under certain circumstances the emitter resistors $R_{11}$, $R_{12}$ are omitted. In this latter case the transistors $Q_1$, $Q_2$ are easily saturated, and it will then be necessary to dimension the frequency of the triggering pulse train or the circuit such, that the transistors $Q_1$, $Q_2$ will remain conductive until even the larger of the capacitors $C_3$, $C_4$ is fully charged, whereby the differential amplifier then responds essentially via the bridge arms to the variable duration of the currents.

In the embodiments shown by way of example, the bridge arms always have two capacitors, but that is not absolutely necessary, and it is also possible always to replace one by resistors.

We claim:

1. A capacitive measuring circuit, comprising:
   first and second bridge arms each including at least one capacitor;
   a differential amplifier having an input connected to each of said bridge arms and an output fed back to at least one of said first or second bridge arms;
   a common oscillator being connected to said first and second bridge arms via one switching element each, each said switching element having two terminals, one terminal being connected to said oscillator and the other one to said respective bridge arm, said oscillator having an output for providing a rectangular pulse train voltage to said switching elements;
   a number of potential sources;
   a first passive circuit element for connecting one of said potential sources to a respective one of said first and second bridge arms, said potential source being connected to the other terminal of said switching element connected to said bridge arm;
   a second passive circuit element for connecting a second potential source to the other of said two bridge arms, said second potential source being connected to the other terminal of said switching element connected to said other of said two bridge arms;
   the rectangular pulse train applied to said switching elements connected to said bridge arms oscillates between a potential higher and a potential lower than said potentials applied to said capacitors of said bridge arms from said potential sources via said passive circuit elements shifted by the amount of the passing through voltage of said switching elements to allow said capacitors to be charged and discharged alternately whereby the duration of the pulses and intervals of the pulse train allows that the charging current of the capacitors drops practically to zero;
   a feedback circuit including only second passive circuit elements only connected with at least one capacitor of one of said two bridge arms via one of said first and second passive elements and with the output of said differential amplifier.

2. Measuring circuit as claimed in claim 1 wherein said switching elements are diodes and said pulse train output of said oscillator fluctuates between fixed values which are respectively above and below the potential, shifted by the forward voltage of said diodes, at the connecting points of the diodes with said first and second bridge arms.

3. Measuring circuit as in claim 1 or 2 wherein each of said first and second bridge arms includes two capacitors and further comprising amplifiers having outputs connected with the respective inputs of said differential amplifier.

4. Measuring circuit as in claim 3 further comprising a fixed potential source and additional diodes connecting said fixed potential source to the connecting points of said first and second bridge arms.

5. Measuring circuit as in claim 4 wherein said amplifiers each include a transistor having an emitter and a base electrode connected to the respective connecting point of said first and second bridge arm and further comprising a resistor interconnecting a respective emitter of said transistors to said fixed potential source.

6. Measuring circuit as claimed in claim 1 further comprising an inverter for inverting the output of said differential amplifier; one of said first and second bridge arms being connected to said output of said differential amplifier via said feedback circuit including one of said first and second passive elements respectively and the other one of said bridge arms being connected to said inverter via the other one of said first and second passive elements respectively.

7. Measuring circuit as claimed in claim 1, said differential amplifier being provided with a second output delivering output signals inverse to that one of said first output, one of said first and second bridge arms being connected to said first output of said differential amplifier via said feedback circuit including one of said first and second passive element respectively and the other one of said bridge arms being connected to said inverting output of said differential amplifier via the other one of said first and second passive element respectively.

* * * * *